United States Patent
Park et al.

(10) Patent No.: US 8,451,665 B2
(45) Date of Patent: May 28, 2013

(54) NON-VOLATILE MEMORY DEVICE AND METHOD FOR OPERATING THE SAME

(75) Inventors: Seong-Je Park, Gyeonggi-do (KR);
Jung-Hwan Lee, Gyeonggi-do (KR);
Ji-Hwan Kim, Gyeonggi-do (KR);
Myung Cho, Gyeonggi-do (KR);
Beom-Seok Hah, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 13/232,304

(22) Filed: Sep. 14, 2011

(65) Prior Publication Data

US 2012/0269020 A1    Oct. 25, 2012

(30) Foreign Application Priority Data

Apr. 21, 2011 (KR) .......................... 10-2011-0037361

(51) Int. Cl.
*G11C 16/04* (2006.01)
(52) U.S. Cl.
USPC ............ 365/185.33; 365/185.17; 365/185.28; 365/185.29
(58) Field of Classification Search
USPC .................................................. 365/185.33
See application file for complete search history.

(56) References Cited

U.S. PATENT DOCUMENTS

| | | | | |
|---|---|---|---|---|
| 7,372,742 | B2 * | 5/2008 | Aritome | 365/185.29 |
| 7,397,706 | B2 * | 7/2008 | Byeon et al. | 365/185.29 |
| 7,529,138 | B2 * | 5/2009 | Park et al. | 365/185.29 |
| 7,649,775 | B2 * | 1/2010 | Kim et al. | 365/185.11 |
| 7,773,429 | B2 * | 8/2010 | Jeon et al. | 365/185.28 |
| 8,077,524 | B2 * | 12/2011 | Lutze et al. | 365/185.24 |
| 2008/0013378 | A1 * | 1/2008 | Crippa et al. | 365/185.17 |
| 2010/0226183 | A1 * | 9/2010 | Kim | 365/185.33 |
| 2012/0140559 | A1 * | 6/2012 | Dong et al. | 365/185.03 |
| 2012/0170365 | A1 * | 7/2012 | Kang et al. | 365/185.03 |

FOREIGN PATENT DOCUMENTS

WO   WO 2010092536   8/2010

OTHER PUBLICATIONS

Notice of Allowance issued by the Korean Intellectual Property Office on Sep. 27, 2012.

* cited by examiner

*Primary Examiner* — Son Mai
(74) *Attorney, Agent, or Firm* — IP & T Group LLP

(57) ABSTRACT

A method for operating a non-volatile memory device includes selecting a word line of a plurality of word lines in response to a program command and an received address, determining whether the selected word line is a word line set among the word lines, performing an erase operation on a second word line group of the word lines in response to a result of the determining, and performing a program operation on the selected word line.

12 Claims, 7 Drawing Sheets

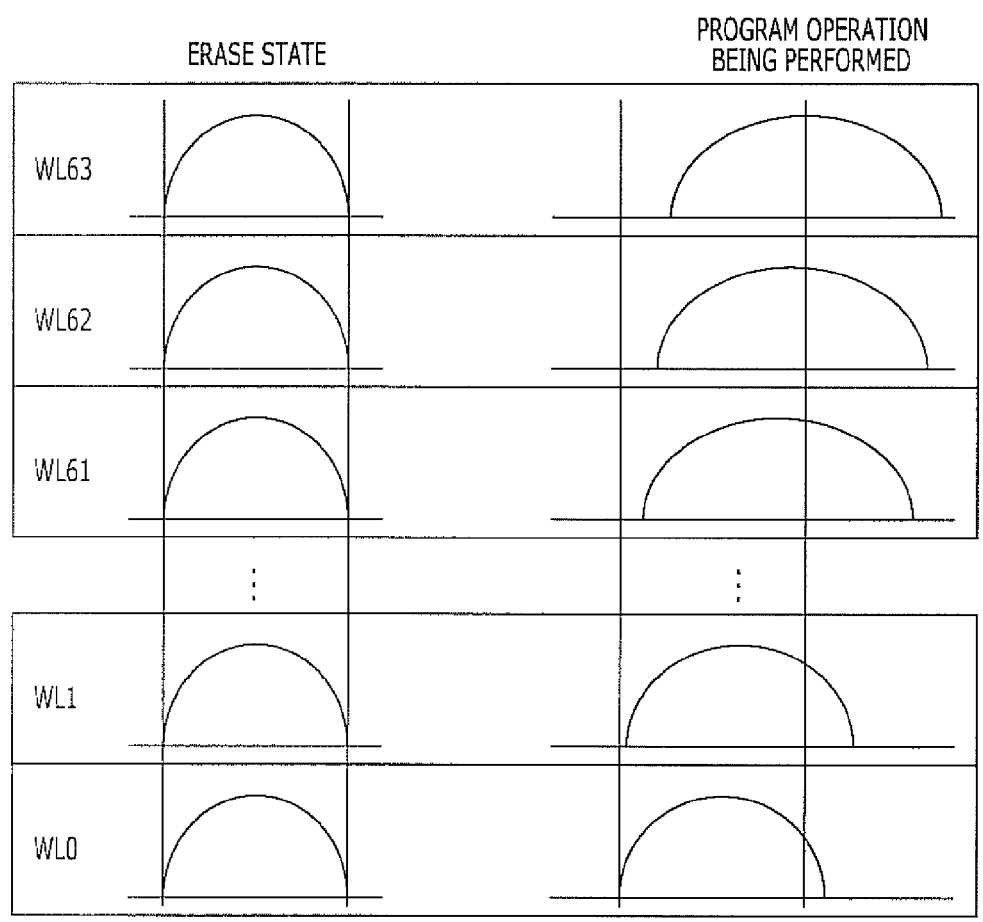

NON-VOLATILE MEMORY DEVICE AND METHOD FOR OPERATING THE SAME

CROSS-REFERENCE TO RELATED APPLICATIONS

The present application claims priority of Korean Patent Application No. 10-2011-0037361, filed on Apr. 21, 2011, which is incorporated herein by reference in its entirety.

BACKGROUND

1. Field

Exemplary embodiments of the present invention relate to a non-volatile memory device, and a method for performing a program operation and an erase operation of the non-volatile memory device.

2. Description of the Related Art

Semiconductor memory devices may be divided into volatile memory devices and non-volatile memory devices based on whether data is to be stored even without a power supply. Non-volatile memory devices such as flash memory devices have both of the advantage of a Random Access Memory (RAM), which is capable of freely programming and erasing data, and the advantage of a Read Only Memory (ROM), which may retain data even without a power supply. In particular, NAND flash memory devices are widely used in a variety of applications for high-capacity data storage, because it is easy to increase the integration degree of the NAND flash memory device.

FIG. 1 illustrates a memory cell array of a NAND flash memory device.

Referring to FIG. 1, the cell array of a NAND flash memory device may include a plurality of cell strings, e.g., cell strings 100 and 110.

The cell strings 100 and 110 include, respectively, between drain selection transistors 101 and 111 and source selection to transistors 103 and 113, a plurality of memory cells coupled in series. The drain selection transistors 101 and 111 and the source selection transistors 103 and 113 are coupled with a drain selection line DSL and a source selection line SSL, and the plurality of memory cells are coupled with a plurality of word lines WL0 to WLN. The cell strings 100 and 110 are selectively coupled with bit lines BL through the drain selection transistors 101 and 111, and the cell strings 100 and 110 are selectively coupled with a common source line CSL coupled with a ground voltage end through the source selection transistors 103 and 113. The multiple cell strings 100 and 110 that are coupled with the bit lines BL, respectively, are coupled in parallel with the common source line CSL so as to form one memory cell block.

To record a data in a memory cell of the non-volatile memory device, that is, to program a memory cell of the non-volatile memory device, the data of all memory cells of a block corresponding to a program operation are to be erased prior to the program operation. The conventional block-based erase operation may be performed by floating a drain selection line DSL and a source selection line SSL, applying an erase voltage, e.g., 0V, to all word lines, and applying a high voltage, e.g., 20V, to a semiconductor substrate. Through the block-based erase operation, the threshold voltages of all the memory cells of the corresponding block may drop to 0V or lower to turn the memory cells into an erase state.

A non-volatile memory device has been developed to increase its integration degree within a smaller size. For example, the number of word lines implemented in one block is increased from 32 to 64. In short, the size of cell strings, i.e., the length corresponding to the number of word lines, of a memory cell array continues to increase, and this may cause degradation in the performance of a non-volatile memory device such as program disturbance.

FIGS. 2A and 2B illustrate a change in the threshold voltage distribution of memory cells due to program disturbance in a non-volatile memory device. Here, FIGS. 2A and 2B show a multi-level cell MLC capable of storing two bits of data as an example.

One memory cell MLC may have four data storage states. When the memory cells have a uniform threshold voltage distribution ideally as shown in FIG. 2A, the threshold voltage of a memory cell in an erase state is approximately 0V or lower and the first read voltage VR1 is approximately 0V.

However, in the actual memory cells, the threshold voltage distribution levels may all increase due to program disturbance and, that is, the distribution graph may move to the right along the threshold voltage level axis as shown in FIG. 2B. Particularly, this phenomenon may be significant in the distribution graph of memory cells in an erase state. Conventional technology has coped with the phenomenon by increasing the read voltage VR1 higher than 0V, but it may decrease a margin for the overall threshold voltage distribution of memory cells.

Also, as the size of cell strings of a memory cell array increases and thus the number of word lines in one block increases, the program disturbance may be more pronounced for the high-level word lines. FIG. 3 shows a change of the threshold voltage distribution of erase-state memory cells when a program operation is performed repeatedly in one block.

Referring to FIG. 3, when there are 64 word lines WL0 to WL63 in one block, the threshold voltage distribution level of the memory cells coupled with the high-level word lines (e.g., a word line WL63) may increase as the program operations are performed onto the block. This is because a program operation is generally performed in the sequence from low-level word lines (e.g., a word line WL0) to high-level word lines.

The program disturbance becomes more pronounced for the high-level word lines first because a pass voltage is also applied to the high-level word lines when the program operation is performed on low-level word lines, and second because as the memory cells coupled to the low-level word lines are programmed, the amount of current flowing the memory cells are decreased and thus the turn-on resistance of the memory cells coupled with the high-level word lines becomes great to raise the threshold voltage of the memory cells.

SUMMARY

An embodiment of the present invention is directed to a non-volatile memory device that may prevent deterioration in the memory cell characteristics, such as program disturbance caused by an increase in the cell string size of a memory cell array, and a method for operating the non-volatile memory device.

In accordance with an embodiment of the present invention, a method for operating a non-volatile memory device includes: selecting a word line of a plurality of word lines in response to a program command and an address; determining whether the selected word line is a word line set among the word lines; performing an erase operation on a first word line group of the word lines in response to a result of the determining; and performing a program operation on the selected word line.

In accordance with another embodiment of the present invention, a method for operating a non-volatile memory device includes: inputting an erase command for a plurality of word lines of a block; floating a first word line group of the word lines; and performing an erase operation by applying an erase voltage to a second word line group of the word lines.

In accordance with still another embodiment of the present invention, a non-volatile memory device include: a memory cell array including a plurality of word lines; and a controller configured to perform a program operation on a word line selected from the word lines and perform an erase operation on a first word line group of the word lines when the selected word line is a word line set among the word lines.

BRIEF DESCRIPTION OF THE DRAWINGS

FIG. 3 illustrates a change in the threshold voltage distribution of erase-state memory cells when a program operation is repeatedly performed in one memory block.

DETAILED DESCRIPTION

Figure 1:
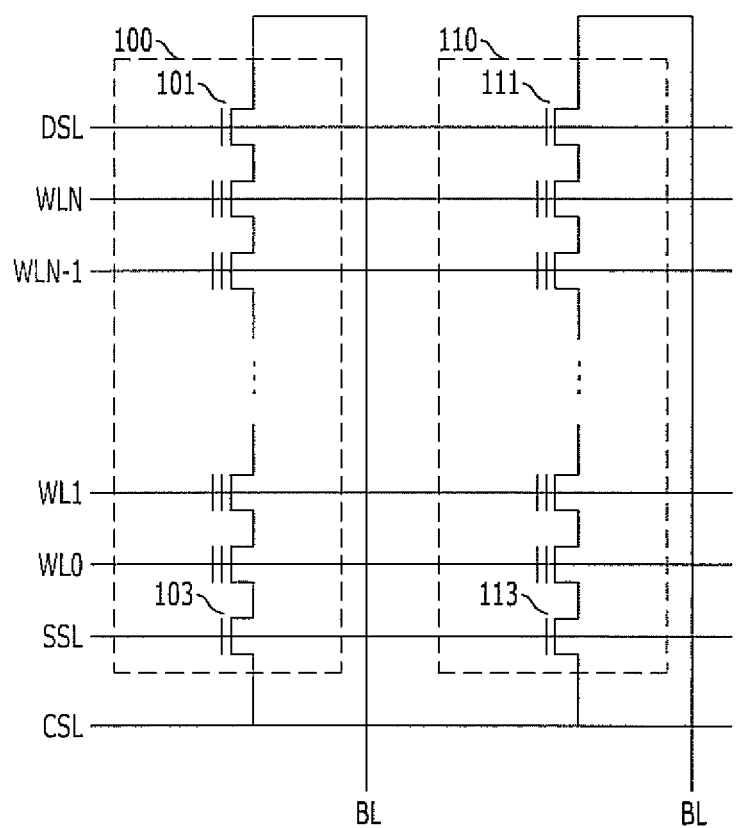
FIG. 1 illustrates a memory cell array of a NAND flash memory device.
Figure 2A:
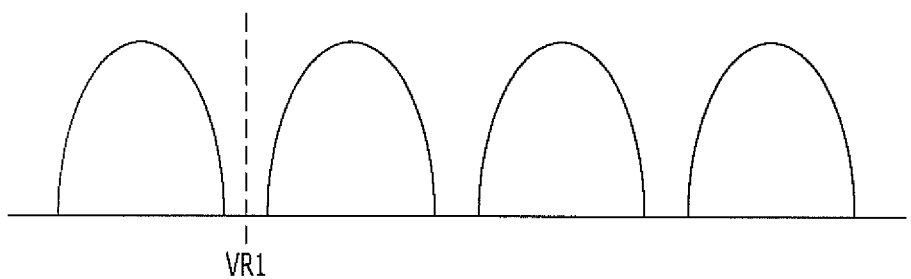
FIGS. 2A and 2B illustrate a change in the threshold voltage distribution of memory cells of a non-volatile memory device due to program disturbance.
Figure 2B:
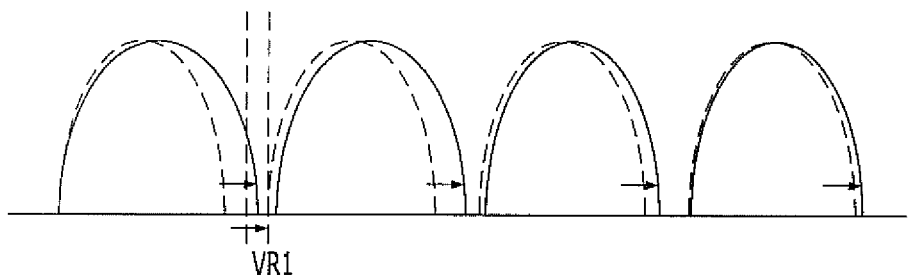

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 4:
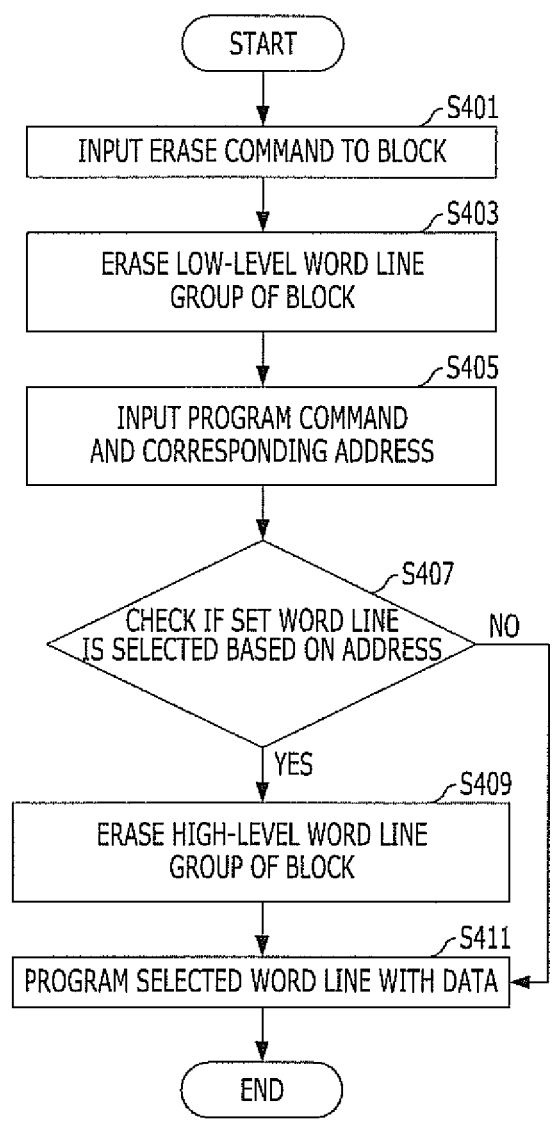
FIG. 4 is a flowchart describing a method for operating a non-volatile memory device in accordance with an embodiment of the present invention.

FIG. 4 is a flowchart describing a method for operating a non-volatile memory device in accordance with an embodiment of the present invention.

Referring to FIG. 4, the method for operating a non-volatile memory device includes: inputting an erase command for a block in step S401; erasing a low-level word line group of the block in response to the erase command in step S403; inputting a program command and an address corresponding to the program command in step S405; checking whether a word line set/predetermined from a plurality of word lines of the block is selected based on the received address in step S407; if the set word line is selected, erasing a high-level word line group of the block in step S409; and programming a data in the selected word line in step S411.

In this embodiment, the word lines of the block are divided into the high-level word line group and the low-level word line group based on the set word line. The word lines of the high-level word line group may be positioned closer to a drain selection line DSL and the word lines of the low-level word line group may be positioned closer to a source selection line SSL, compared as the set word line. Here, any of the word lines may be selected as the set word line according to circumstances, and the set word line may belong to the high-level word line group or the low-level word line group.

Also, the address of the set word line may be stored as a predetermined value in the inside of a memory device or a memory controller, or it may be applied along with an erase command or a program command. For example, a semiconductor memory device may be realized in such a manner that the address of the set word line is directly applied in response to an erase command between the step S401 of inputting the erase command for a block and the step S403 of erasing a low-level word line group during a block erase operation.

Based on the above method, an embodiment of the present invention may apply a partial erase algorithm to each word line group. When the set word line is selected based on the address applied in response to a program command during a program operation, a partial erase operation is performed in step S409 to erase the high-level word line group, and then a program operation is performed onto the selected word line in step S411. Otherwise, the partial erase operation for erasing the high-level word line group may be performed after the program operation is performed onto the selected word line. Through the process, an increase in the cell threshold voltage distribution level of the high-level word lines due to program disturbance (see FIG. 3) in the course of programming the low-level word lines may be prevented and the cell threshold voltage distribution of the high-level word lines may be turned into the initial erase state.

Also, when an erase operation for the corresponding block is performed before (or after) the program operation, the partial erase operation is performed onto the low-level word line group in step S403 in response to the erase command in step S401. In this case, the program operation after the erase operation may be performed in the order from a low-level word line close to the source selection line SSL to a high-level word line close to the drain selection line DSL. That is, after the erase operation is performed on the low-level word line group, the program operation may be sequentially performed in the low-level word line group up to the set word line. As the program operation is performed on the set word line, the erase operation may be performed on the high-level word line group and the program operation may be sequentially performed in the high-level word line group. The sequential program operations may be controlled by the memory controller.

In this method, the back pattern dependency phenomenon that the cell threshold voltage distribution level of the low-level word line group increase when the high-level word line group is programmed may also be prevented to a great extent. Furthermore, the cycle-life of the memory device may be protected from being reduced by controlling the erase operation performed onto the high-level word line group.

Figure 5A:
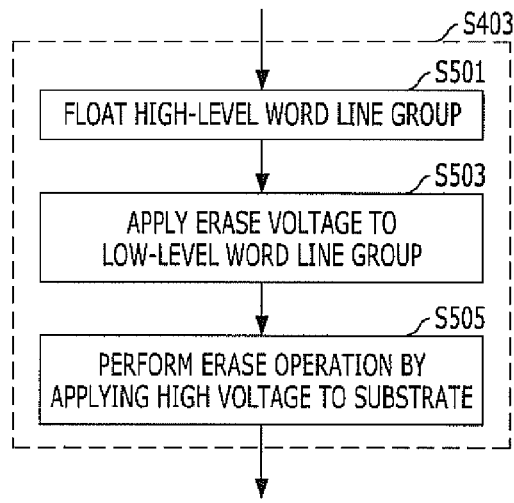
FIG. 5A is a flowchart describing an erase process S403 of erasing a low-level word line group.
Figure 5B:
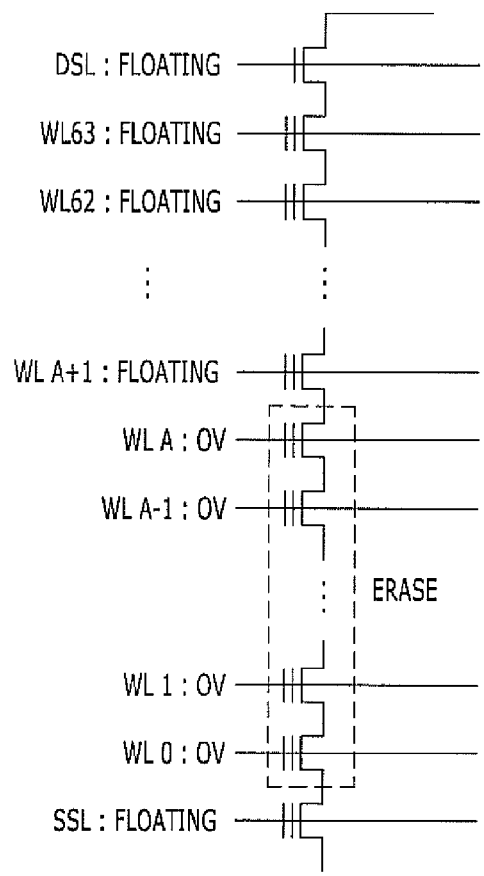
FIG. 5B illustrates a cell string in which the operation of erasing the low-level word line group is performed.

FIG. 5A is a flowchart describing the erase process S403 of erasing the low-level word line group, and FIG. 5B illustrates a cell string to describe the operation of erasing the low-level word line group. Here, a cell string includes 64 word lines WL0 to WL63 is shown as an example.

The erase process S403 of erasing the low-level word line group includes: floating the high-level word line group in step S501; applying an erase voltage to the low-level word line group in step S503; and performing an erase operation by applying a high voltage to a substrate in step S505.

To be specific, as illustrated in FIG. 5B, the partial erase operation of the low-level word line group may be performed by floating a drain selection line DSL, a source selection line SSL, and a high-level word line group WLA+1 to WL63 of a set word line WLA, and applying a high voltage (e.g., 20V) to a semiconductor substrate (e.g., a well region) while applying an erase voltage (e.g., 0V) to a low-level word line group WL0 to WLA including the set word line WLA. Through the process, the memory cells coupled with the high-level word line group WLA+1 to WL63 may maintain data and the memory cells coupled with the low-level word line group WL0 to WLA including the set word line WLA may be brought into an erase state even in one block.

Figure 6A:
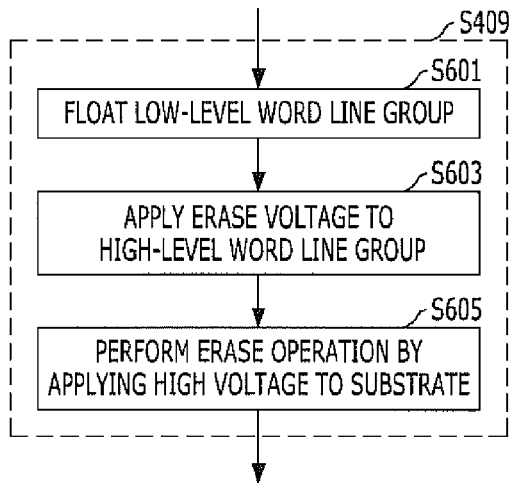
FIG. 6A is a flowchart describing an erase process S409 of erasing a high-level word line group.
Figure 6B:
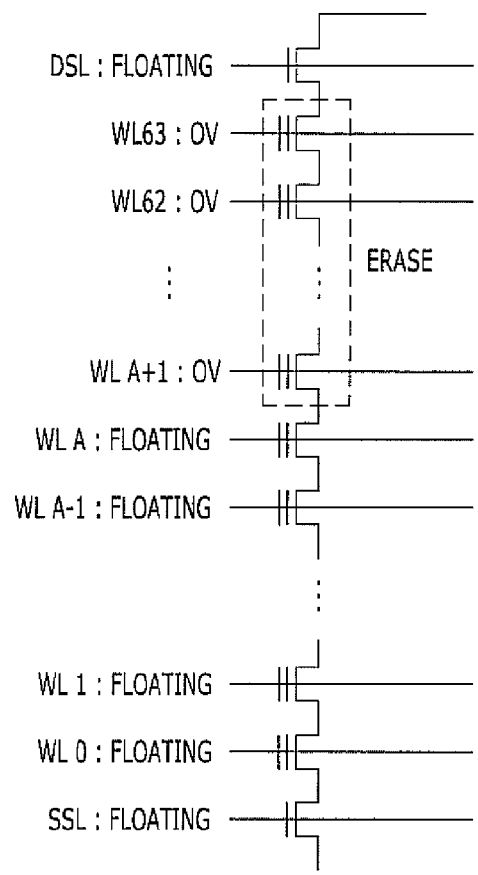
FIG. 6B illustrates a cell string in which the operation of erasing the high-level word line group is performed.

FIG. 6A is a flowchart describing the erase process S409 of erasing the high-level word line group, and FIG. 6B illustrates a cell string to describe the erase operation of erasing the high-level word line group. Here, the cell string includes 64 word lines WL0 to WL63 is shown as an example.

The erase process S409 of erasing the high-level word line group includes: floating the low-level word line group in step S601; applying an erase voltage to the high-level word line group in step S603; and performing an erase operation by applying a high voltage to a substrate in step S605.

To be specific, as illustrated in FIG. 6B, the partial erase operation of the high-level word line group may be performed by floating a drain selection line DSL, a source selection line SSL, and the low-level word line group WL0 to WLA including the set word line WLA, and applying a high voltage (e.g., 20V) to a semiconductor substrate (e.g., a well region) while applying an erase voltage (e.g., 0V) to the high-level word line group WLA+1 to WL63. Through the process, the memory cells coupled with the low-level word line group WL0 to WLA including the set word line WLA may maintain data and the memory cells coupled with the high-level word line group WLA+1 to WL63 may be brought into an erase state even in one block.

Figure 7:
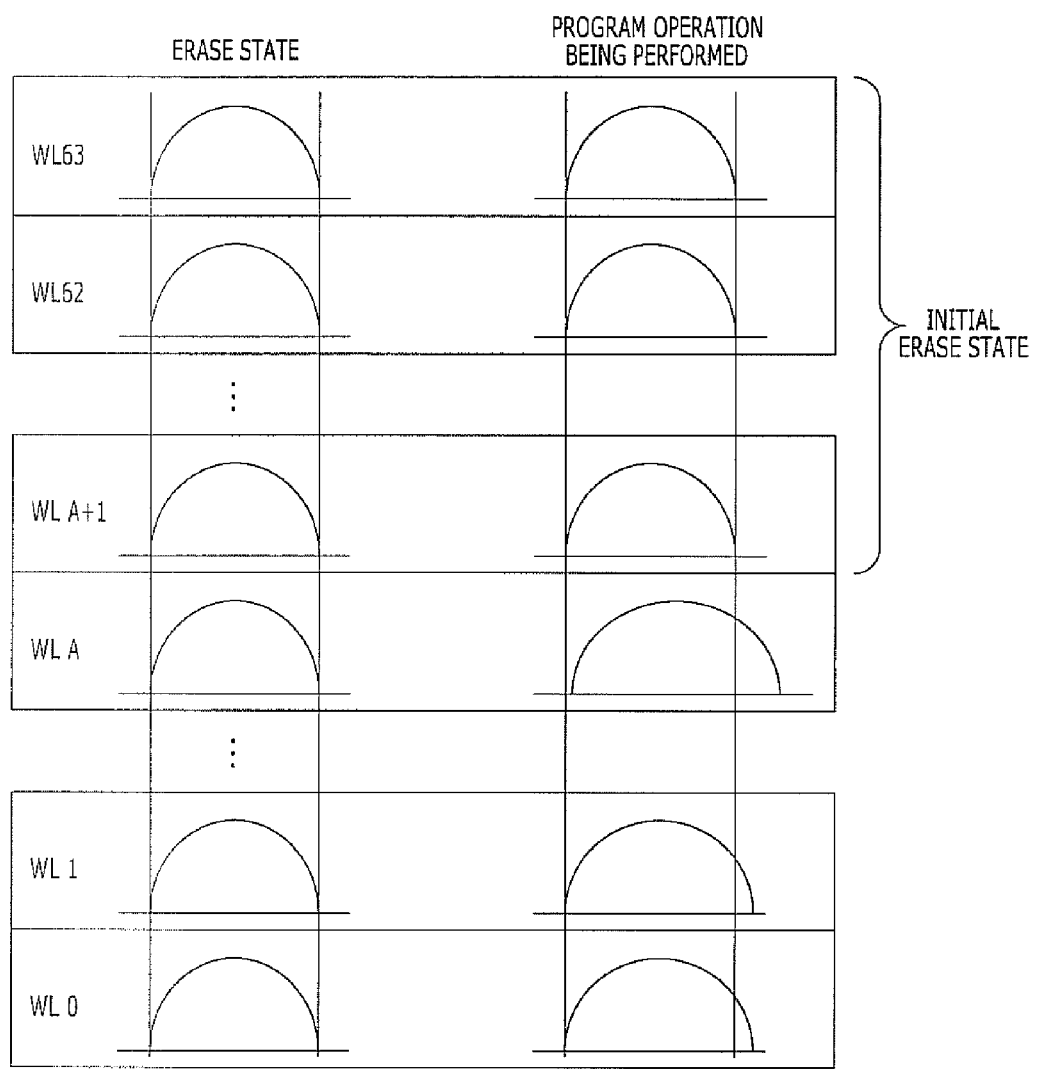
FIG. 7 illustrates the threshold voltage distribution of erase-state memory cells in accordance with an embodiment of the present invention.

FIG. 7 illustrates the threshold voltage distribution of erase-state memory cells in accordance with an embodiment of the present invention.

Referring to FIG. 7, since an erase operation is performed onto the high-level word line group WLA+1 to WL63 during a program operation of a set word line WLA, the threshold voltages of the memory cells coupled with the high-level word line group WLA+1 to WL63 may be recovered to the initial erase state (e.g., 0V or lower). In accordance with an exemplary embodiment of the present invention, the program disturbance phenomenon of the high-level word line group may be prevented to a great extent, compared to that of FIG. 3.

In other words, although the threshold voltage distribution level of the memory cells coupled with the low-level word lines may be somewhat increased as the program operation is performed on the low-level word line group and program disturbance phenomenon may partially occur, the program disturbance phenomenon may be prevented from becoming more serious as it goes toward the high-level word lines by keeping the increased threshold voltage distribution level from affecting the high-level word line group.

Meanwhile, in the above embodiment of the present invention, although only one particular word line is set in one block, more than two word lines may be set as a particular word line group. To take an example, two word lines WL21 and WL42 among the 64 word lines WL0 to WL63 in the inside of a cell string may be set as a particular word line group. In this case, if the first word line WL21 is selected while sequentially performing the program operation from the low-level word line, the word lines WL22 and WL42 are erased and then sequentially programmed. If the second word line WL42 is selected while subsequently performing the program operation, the word lines WL43 to WL63 are erased and then programmed.

According to an embodiment of the present invention, the degradation in the memory cell characteristic, such as program disturbance, which occurs as the size of cell strings increases, may be prevented by using a partial erase algorithm in the course of a program operation.

Also, the partial erase algorithm may be applied to a block erase operation so as not to repeat the erase operation onto high-level word lines and thus protect the cycle-life of non-volatile memory device from being reduced.

While the present invention has been described with respect to the specific embodiments, it will be apparent to those skilled in the art that various changes and modifications may be made without departing from the spirit and scope of the invention as defined in the following claims.

What is claimed is:

1. A method for operating a non-volatile memory device, comprising:
    performing an erase operation on a second word line group different from a first word line group of a plurality of word lines in response to an erase command and an address corresponding to the erase command;
    selecting a word line of the plurality of word lines in response to a program command and an address corresponding to the program command;
    determining whether the selected word line is a word line set among the plurality of word lines;
    performing an erase operation on the first word line group of the plurality of word lines in response to a result of the determining; and
    performing a program operation on the selected word line.

2. The method of claim 1, wherein the first word line group comprises word lines positioned closer to a drain selection line (DSL) than the set word line.

3. The method of claim 1, wherein the performing of the erase operation on the first word line group comprises:
    floating the second word line group of the word lines that are different from the first word line group; and
    applying an erase voltage to the first word line group.

4. The method of claim 3, wherein the second word line group comprises word lines positioned closer to a source selection line (SSL) than the set word line.

5. The method of claim 1, wherein the address of the set word line is stored in a memory device or inputted to the memory device with the erase command.

6. The method of claim 1, wherein the performing of the erase operation on the second word line group comprises:
    floating the first word line group; and
    applying an erase voltage to the second word line group.

7. A method for operating a non-volatile memory device, comprising:
    inputting an erase command for a plurality of word lines of a block;
    floating a first word line group different from a second word line group of the plurality of word lines;
    performing an erase operation by applying an erase voltage to the second word line group of the plurality of word lines; and
    performing an erase operation on the first word line group of the plurality of word lines and a program operation on the second word line group in response to a program command and an address corresponding to the program command.

8. The method of claim 7, further comprising:
inputting an address of a word line set among the word lines in response to the erase command.

9. The method of claim 7, wherein the first word line group comprises word lines positioned closer to a drain selection line (DSL) than the set word line.

10. The method of claim 7, wherein the second word line group comprises word lines positioned closer to a source selection line (SSL) than the set word line.

11. A non-volatile memory device, comprising:
a memory cell array comprising a plurality of word lines; and
a controller configured to perform an erase operation on a second word line group different from a first word line group of a plurality of word lines in response to an erase command and an address corresponding to the erase command, and perform a program operation on a word line selected from the plurality of word lines and perform an erase operation on a first word line group of the plurality of word lines when the selected word line is a word line set among the plurality of word lines.

12. The non-volatile memory device of claim 11, wherein the first word line group comprises word lines positioned closer to a drain selection line (DSL) than the set word line.

* * * * *